United States Patent [19]

Murakami et al.

[11] Patent Number: 4,780,686
[45] Date of Patent: Oct. 25, 1988

[54] SEMICONDUCTOR DIFFERENTIAL AMPLIFIER

[75] Inventors: Shuji Murakami; Katsuki Ichinose, both of Itami, Japan

[73] Assignee: Mitsubishi Denki Kabushiki Kaisha, Tokyo, Japan

[21] Appl. No.: 1,028

[22] Filed: Jan. 7, 1987

[30] Foreign Application Priority Data

Jan. 8, 1986 [JP] Japan .................... 61-2579

[51] Int. Cl.[4] ............................................. H03F 3/45
[52] U.S. Cl. ..................................... 330/253; 330/257
[58] Field of Search ............... 330/253, 257; 307/355, 307/356

[56] References Cited

U.S. PATENT DOCUMENTS

| | | | |
|---|---|---|---|
| 4,004,245 | 1/1977 | Ochi et al. | 330/253 |
| 4,509,147 | 5/1985 | Tanimura et al. | 365/190 |
| 4,622,521 | 11/1986 | Redfern | 330/253 X |
| 4,653,654 | 1/1986 | Arai et al. | 330/253 X |

FOREIGN PATENT DOCUMENTS 60-213108 10/1985 Japan .

OTHER PUBLICATIONS

Tietze et al., "Halbleiter-Schaltungstechnik", pp. 87, 103, Springer-Verlag, 1980.

*Primary Examiner*—James B. Mullins
*Attorney, Agent, or Firm*—Birch, Stewart, Kolasch & Birch

[57] ABSTRACT

A semiconductor differential amplifier includes first and second MOS transistors of a first conductivity type acting as driver transistors, and third through sixth MOS transistors of a second conductivity type acting as load transistors. First and second input terminals are respectively connected to gate terminals of the first and fifth, and second and sixth transistors. Therefore, since input signals are applied to transistors of both the load and driver sections of the amplifier, the amplifier exhibits a higher sensitivity for detecting relatively small differences between the voltage at the first input terminal and the voltage at the second input terminal.

6 Claims, 4 Drawing Sheets

SEMICONDUCTOR DIFFERENTIAL AMPLIFIER

FIELD OF THE INVENTION

The present invention relates to a semiconductor differential amplifier.

BACKGROUND ART

FIG. 2 shows a prior art semiconductor differential amplifier. In FIG. 2, the reference characters Q1 and Q2 designate a third and a fourth load P channel MOS transistor having an equal gate width and gate length, respectively. The reference characters Q3 and Q4 designate a first and a second driving N channel MOS transistor having an equal gate width and gate length, respectively. The reference characters D and $\overline{D}$ designate a pair of input terminals. The reference character N designates a connection node of the drains of the transistors Q1 and Q3. The reference character $\overline{RD}$ designates a connection node of the drains of the transistors Q2 and Q4, $\overline{RD}$ being an output terminal of this differential amplifier. The reference character Q5 designates a power cut N channel MOS transistor. The reference character SE designates a power cut internal signal. The reference character Vcc designates a power supply voltage, and the reference character GND designates a ground voltage.

The device operates as follows.

Supposing that the power cut internal signal SE is at "H" level, the transistor Q5 is turned on an the differential amplifier is activated.

In such a state, the transistor Q1 has a common gate drain, and therefore the variation of the voltage of the node N is small relative to the variation of the voltage of the input terminal D. The node N also functions as a gate input of the transistor Q2 and if the voltages of the input terminals D and $\overline{D}$ are equal to each other, the output at node $\overline{RD}$ will be the same voltage as that of the node N. The voltages of the input terminals D and $\overline{D}$ and the sizes of the transistors Q1 to Q4 are established such that the transistors Q2 and Q4 enter an equilibrium state at the pentode region. In this state, when a slight voltage difference arises between input terminals D and $\overline{D}$ the transistors Q2 and Q4 go out of equilibrium, thereby resulting in a large variation of the voltage at the output node $\overline{RD}$.

Furthermore, when the power cut internal signal SE is at an "L" level thereby to turn off the transistor Q5, the quiescent currents which penetrate through the transistors Q1 to Q3, or the transistors Q2 to Q4, respectively, are eliminated, whereby the device enters into the power cut state.

In the prior art semiconductor differential amplifier of such construction, the voltage difference between the input terminal D and $\overline{D}$ is received only by the N channel MOS transistor, and thus the ability of pulling up the voltage at the node N or the output $\overline{RD}$ to the power supply voltage side is small, therefore it is not possible to obtain a high sensitivity against a small voltage difference between the terminal pair D and $\overline{D}$.

SUMMARY OF THE INVENTION

An object of the present invention is to provide an improved semiconductor differential amplifier having a high sensitivity.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor differential amplifier for amplifying the voltage difference between a first and a second input terminal and providing an output signal on an output terminal representing said difference, which comprises first conductivity type first and second MOS transistors and second conductivity type third to sixth MOS transistors; the gates of said first and fifth MOS transistors being connected to said first input terminal; the gates of said second and sixth MOS transistors being connected to said second input terminal; the drains of said first, third, and fifth MOS transistors and the gates of said third and fourth MOS transistors being connected with each other; the drains of said second, fourth, and sixth transistors being connected to an output terminal; the sources of said first and second MOS transistors being connected to a first constant voltage source; and the sources of said third to sixth MOS transistors being connected to a second constant voltage source.

BRIEF DESCRPTION OF THE DRAWINGS

DETAILED DESCRIPTION OF THE PREFERRED EMBODIMENTS

Figure 1:
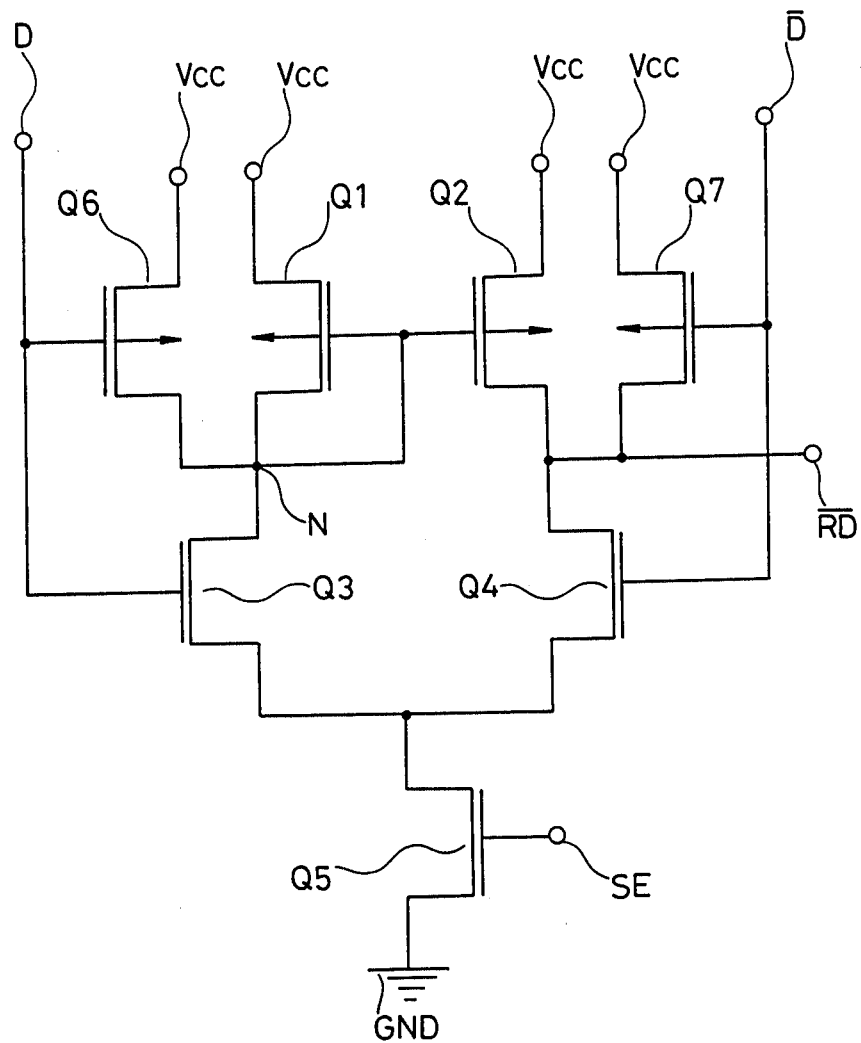
FIG. 1 is a circuit diagram showing a semiconductor differential amplifier of a preferred embodiment of the present invention.

In order to explain the present invention in detail, reference will be particularly made to FIG. 1.

Figure 2:
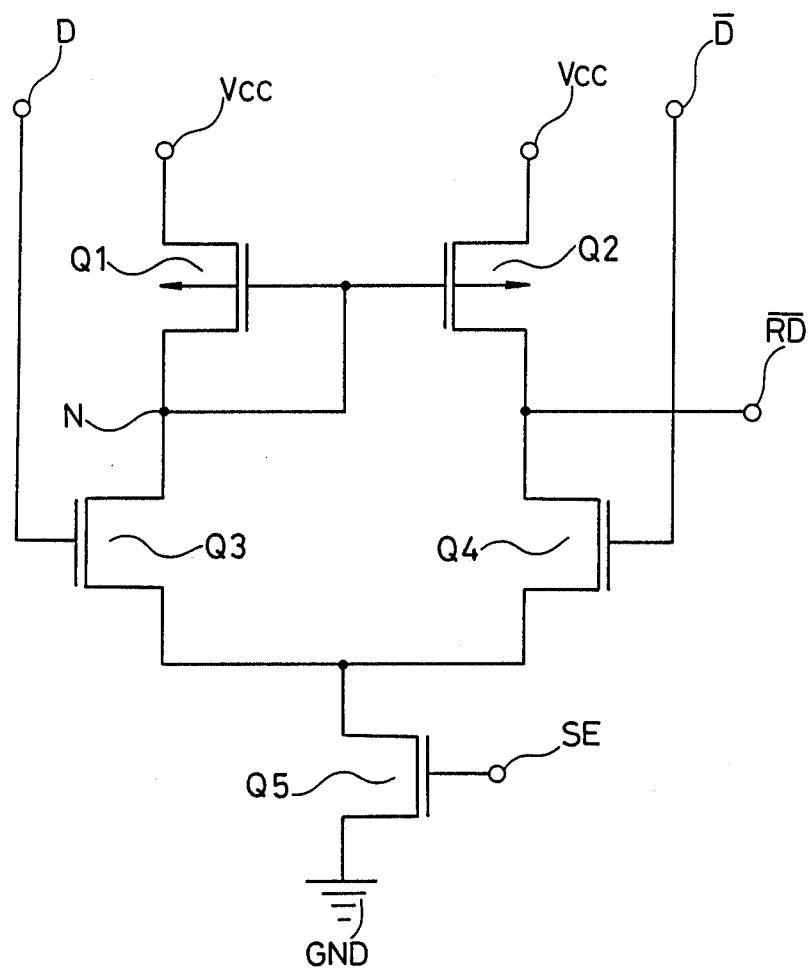
FIG. 2 is a circuit diagram showing a prior art semiconductor differential amplifier.

FIG. 1 shows a semiconductor differential amplifier as an embodiment of the present invention. In FIG. 1, the same reference numerals as those shown in FIG. 2 are used to designate the same elements. In FIG. 1, the reference characters Q6 and Q7 designate P channel fifth and sixth MOS transistors having an equal gate width and gate length, respectively. The fifth transistor Q6 is connected between the power supply voltage Vcc and the node N, and the gate thereof is connected to the input terminal D. The sixth transistor Q7 is connected between the power supply voltage Vcc and the output terminal $\overline{RD}$, and the gate thereof is connected to the other input terminal $\overline{D}$.

The device is operated as follows.

The two P channel MOS transistors Q6 and Q7 are provided symmetrically at the left and right, and the node N and the output $\overline{RD}$ are kept at equal voltages when the input terminals D and $\overline{D}$ are at equal voltages similarly as in the prior art device.

Now suppose that a slight voltage difference arises between the input terminal pair D and $\overline{D}$. The transistor Q6 becomes more conductive when the voltage of the terminal D decreases, and the transistor Q6 becomes more non-conductive when the voltage of the terminal D rises. Accordingly, transistor Q6 has an effect of increasing the variation of the voltage at the node N, that is, the gate voltage of the transistor Q2. Furthermore, because the direction of the change of the input terminal $\overline{D}$, that is, the gate voltage of the transistor Q7 is the same as the direction of the change of the gate voltage of the transistor Q2, the voltage variation at the output node $\overline{RD}$ increases as a result of any of the transistors Q6 and Q7.

Figure 3:
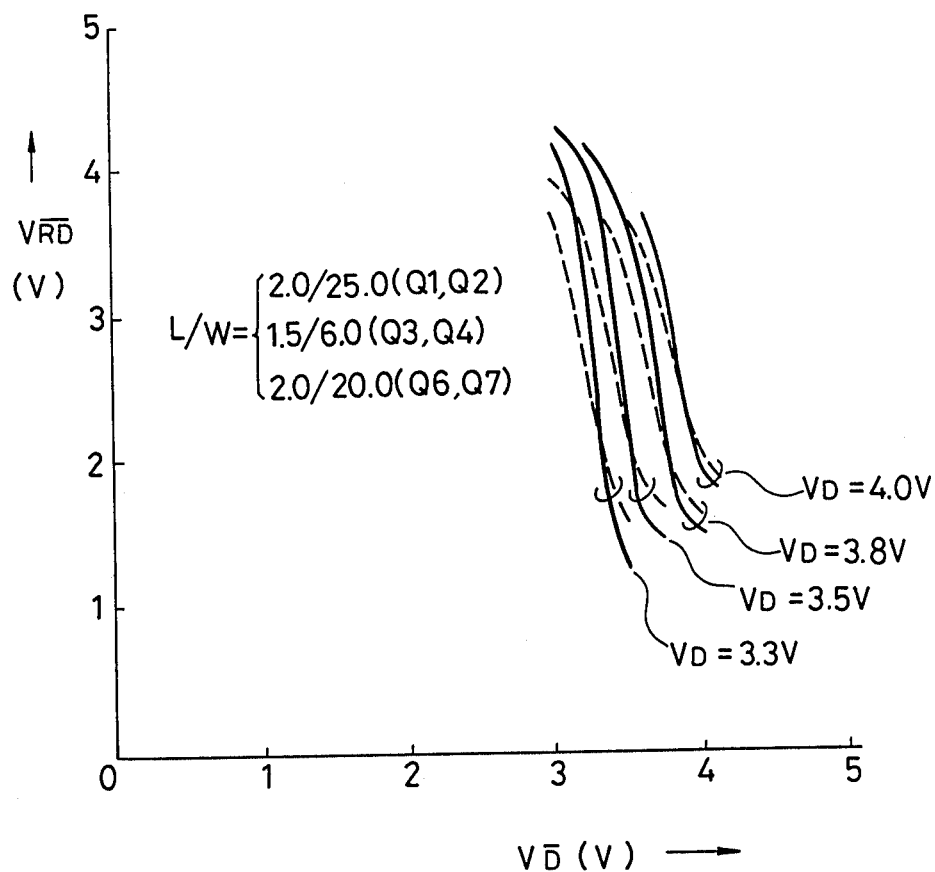
FIG. 3 is a diagram showing the input vs output transmission characteristics of the prior art device and the device of the present invention.

FIG. 3 is a diagram showing the input vs output transmission characteristics of the pior art device and the present embodiment. In FIG. 3, the broken lines show the characteristics of the prior art device, and the solid lines show the characteristics of the present embodiment. In FIG. 3, the reference characters $V_D$, $V_{\overline{D}}$, and $V_{\overline{RD}}$ designate voltages of the terminals D, $\overline{D}$, and $\overline{RD}$. Herein, the gate length L and the gate width W of the transistors are established such that L=2.0 μm and W=25.0 μm for transistors Q1 and Q2, L=1.5 μm and W=6.0 μm for transistors Q3 and Q4, and L=2.0 μm and W=20.0 μm for transistors Q6 and Q7. For example, when the voltage $V_D$ varies from 3.8 V to 3.7 V in a case where $V_D$=3.8 V, the variation quantity of the output voltage $V_{RD}$ is 0.6 V in the present embodiment as opposed to that of the prior art device which is 0.35 V. Thus, the amplification factor is enhanced about 70%.

Figure 4:
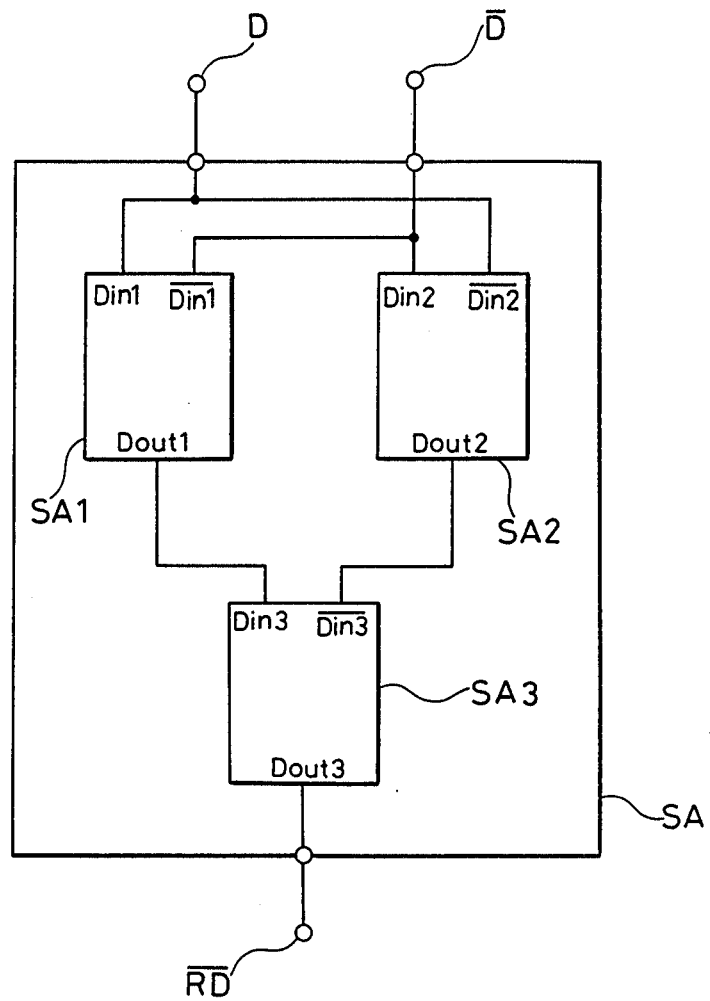
FIG. 4 is a diagram showing a circuit in which the amplification factor is enhanced with the use of the prior art differential amplifier shown in FIG. 2.

There is conventionally known a method of constructing a two stage differential amplifier in order to enhance the sensitivity of the differential amplifier. FIG. 4 shows such a construction. In FIG. 4, the reference characters SA$_1$ to SA$_3$ designate a first to a third differential amplifier portion. The reference characters $D_{in1}$ and $D_{\overline{in1}}$ designate an input terminal pair of the first differential amplifier portion SA$_1$. Similarly as above the reference characters $D_{in2}$, $D_{\overline{in2}}$ and $D_{in3}$, $D_{\overline{in3}}$ designate input terminal pairs of the second and the third differential amplifier portions SA$_2$ and SA$_3$, respectively. Furthermore, the reference characters $D_{out1}$, $D_{out2}$, and $D_{out3}$ designate output terminals of the differential amplifier portions SA$_1$, SA$_2$, and SA$_3$, respectively. The reference character SA designates a differential amplifier constituted by the first to third differential amplifier portions SA$_1$ to SA$_3$.

The input terminals D and $\overline{D}$ of the differential amplifier SA are connected to the terminals $D_{in1}$, $D_{\overline{in2}}$ and $D_{\overline{in1}}$, $D_{in2}$, respectively, and the terminals $D_{out1}$ and $D_{out2}$ are connected to the terminals $D_{in3}$ and $D_{\overline{in3}}$, respectively. The terminal $D_{out3}$ is an output $\overline{RD}$ of the differential amplifier SA.

In this differential amplifier, first of all, amplifications are conducted by first stage differential amplifier portions SA$_1$ and SA$_2$ in directions reverse to each other, thereby enlarging the voltage difference between the terminals $D_{out1}$ and $D_{out2}$ relative to the voltage difference between the input terminals D and $\overline{D}$, the voltage difference being further amplified by the second stage differential amplifier portion SA$_3$.

In this conventional method, however, three stages of differential amplifiers SA$_1$, SA$_2$, and SA$_3$ as fundamental units are used, resulting in an increase in the area of the circuit. To the contrary, in the present invention, only two P channel MOS transistors are added to a differential amplifier as a fundamental unit, and the amplification factor is enhanced while suppressing the increase in area to a minimum.

Herein, the ratio W/L of the gate width W and the gate length L of the MOS transistor is called a conductance factor A. When the conductance factors A6 and A7 of the transistors Q6 and Q7 are larger than the conductance factors A1 and A2 of the transistors Q1 and Q2, the circuits comprising the transistors Q4 and Q7 and the transistors Q3 and Q6, respectively, exhibit dominant CMOS inverter characteristics. Therefore, although the amplification factor when the input voltage is matched with the characteristics of the differential amplifier is large, the allowable range of the input voltage for obtaining matching characteristics becomes narrow, therefore the function as a differential amplifier which is operated based on only the relative difference of the input voltages becomes weak. Accordingly, the conductance factors A6 and A7 are desirably made smaller than the conductance factors A1 and A2, respectively.

In the above-illustrated embodiment, an N channel transistor is used as a driving transistor and a P channel MOS transistor is used as a load transistor, but the present invention can be applied to a case where a P channel MOS transistor is used as a driving transistor and an N channel MOS transistor is used as a load transistor.

In the above-illustrated embodiment, the conductance factors A of the transistors Q1 and Q2, the transistors Q3 and Q4, and the transistors Q6 and Q7 are made equal to each other, respectively, but it is only required that the conductance factor ratios A of the transistors Q1, Q3, and Q6 are equal to the conductance factor ratios A of the transistors Q2, Q4, and Q7, that is, A1/A2=A3/A4=A6/A7, with no unfavorable influence on the DC current differential amplification characteristics.

Furthermore, in the illustrated embodiment, an N channel MOS transistor Q5 is used as a power cut MOS transistor and this is inserted between the remainder of the circuit and ground, but any type of power cut MOS transistor which cuts off the current penetrating from the P channel MOS transistor to the N channel MOS transistor in the differential amplifier can be used.

As is evident from the foregoing description, according to the present invention, signal inputs from the input terminal pair are designed to be received by the N channel and the P channel MOS transistor, whereby quite a small voltage difference between the input terminals is sensed with a high sensitivity.

What is claimed is:
1. A semiconductor differential amplifier, comprising:
   first and second MOS transistors of a first conductivity type having source terminals connected to a first constant voltage source; and
   third through sixth MOS transistors of a second conductivity type having source terminals connected to a second constant voltage source,
   gate terminals of said first and fifth MOS transistors being connected to a first input terminal,
   gate terminals of said second and sixth MOS transistors being connected to a second input terminal,
   drain terminals of said first, third and fifth MOS transistors and gate terminals of said third and fourth MOS transistors being connected to a common node, and
   drain terminals of said second, fourth and sixth MOS transistors being connected to an output terminal,
   wherein an output signal produced at said output terminal is represented of a voltage difference between first and second input signals applied to said first and second input terminals, respectively.

2. The semiconductor differential amplifier of claim 1, further comprising a power-cut MOS transistor connected to said first constant voltage source and the source terminals of said first and second MOS transistors and a gate terminal coupled to receive a power-cut signal, to control the supply of power to said first through sixth transistors.

3. The semiconductor differential amplifier of claim 2, wherein said power-cut MOS transistor is of said first conductivity type.

4. The semiconductor differential amplifier of claim 2, wherein said power-cut MOS transistor is of said second conductivity type.

5. The semiconductor differential amplifier of claim 2, wherein the conductance factor ratios A1/A2, A3/A4 and A5/A6 are equal to each other, in which
$A_i$ = the conductance factor of the $i^{th}$ MOS transistor = W/L,
W = width of the gate of transistor i,
L = length of the gate of transistor,and
$1 \leq i \leq 6$.

6. The semiconductor differential amplifier of claim 1, wherein the conductance factor ratios A1/A2, A3/A4 and A5/A6 are equal to each other, in which
$A_i$ = the conductance factor of the $i^{th}$ MOS transistor = W/L,
W = width of the gate of transistor i,
L = length of the gate of transistor i, and
$1 \leq i \leq 6$.

* * * * *